United States Patent [19]

Kuo et al.

[11] Patent Number: 5,757,301
[45] Date of Patent: May 26, 1998

[54] INSTABILITY RECOVERY METHOD FOR SIGMA-DELTA MODULATORS

[75] Inventors: Tai-Haur Kuo; Jhy-Woei Yeh, both of Tainan, Taiwan

[73] Assignee: National Science Council, Taipei, Taiwan

[21] Appl. No.: 847,097

[22] Filed: May 1, 1997

[51] Int. Cl.$^6$ .................................................. H03M 3/00
[52] U.S. Cl. ................................................... 341/143
[58] Field of Search ........................... 341/143, 120, 341/166, 155, 172

[56] References Cited

U.S. PATENT DOCUMENTS

| | | | |
|---|---|---|---|
| 5,012,244 | 4/1991 | Wellard et al. | 341/143 |
| 5,248,972 | 9/1993 | Karema et al. | 341/143 |
| 5,379,039 | 1/1995 | Charaska et al. | 341/143 |
| 5,654,711 | 8/1997 | Fujimori | 341/143 |

Primary Examiner—Brian K. Young
Attorney, Agent, or Firm—Hitt Chwang & Gaines, P.C.

[57] ABSTRACT

A method for stabilize single-stage sigma-delta modulators is disclosed. The method of the present invention employs stability detectors to detect whether the modulator enters the unstable region or not. And internal signal paths that already exist in stable operation are used to recover a unstable modulator to stable region. In the first kind of embodiment, stabilization effect is supported by reduction of effective order. And in the second kind of embodiment, individual instability recovery in each stage in the modulator provide the necessary stabilization mechanism. The present invention can be applied to various configurations, such as multiple feedback and feedforward, and various application, like low-pass and band-pass system.

50 Claims, 8 Drawing Sheets

INSTABILITY RECOVERY METHOD FOR SIGMA-DELTA MODULATORS

FIELD OF THE INVENTION

The invention relates to a method of stabilizing a single-stage sigma-delta modulator. More specifically, an instability recovery method applied to single-stage sigma-delta modulators is disclosed.

BACKGROUND OF THE INVENTION

Sigma-delta modulation has recently been a popular technique for obtaining high resolution data conversion. In such technique, high resolution results from oversampling, noise-shaping as well as noise filtering. Such technique has been successfully applied to DC measurement, voice band, audio processing, ISDN and communication system, etc. For detail discussion of sigma-delta modulation techniques, relevant to the principles and terminologies that follows in the context, please refer to a selected reprint volume entitled "Overampling delta-sigma data converters", edited by J.C. Candy and G.C. Temes, IEEE Press, 1992.

For obtaining higher resolution but lower sampling frequency, it is necessary to design a modulator with higher orders. By cascading low-order (order N=1 or 2) modulators, many high-order modulators have been published. At the same time, efforts have also been tried to design single-stage high-order modulators, which provide features such as less components matching requirement, less pattern noise, and less die area. Nevertheless, there exists inherent stability problem in single-stage high-order modulators, and this problem plays a significant obstacle in the development of high-order modulators. For tackling the stability problem, one should design a more stable modulator so that it will seldom enter unstable region in normal operation. In addition, instability recovery mechanism should be employed to ensure proper operation after short unstable period. Otherwise, a high-order modulator may lock in oscillation between clipping levels in most of the time, even though the input signal is removed.

There have been several techniques disclosed to play the instability recovery role in sigma-delta modulators, e.g. reset mechanism and clippers. However, either sacrifice of performance in normal operation or generation of severe distortion in recovery process have been discovered. Therefore, it seems that a different approach for instability recovery for single-stage sigma-delta modulators is necessary.

SUMMARY OF THE INVENTION

In this invention we disclose a method for stabilizing single-stage sigma-delta modulators. According to the present invention, a modulator can be recovered to stable operation after an unstable period. There exits two kinds of embodiments to realize the proposed invention.

In the first kind of embodiment, the effective order of the modulator is reduced when instability occurs. The reduction of effective order has a global stabilization effect for a modulator to be recovered from unstable operation. In this invention, an instability detector is used to check whether the modulator enters the unstable region or not. A selection means is employed to adjust the effective order.

In the second kind of embodiment, by adopting the spirit of both individual unstable recovery and reduction of effective order, individual stage in the modulator is recovered from unstable operation provided that a recovery signal is supported. The recovery signal is obtained from an internal signal path that already exits in the modulator, rather than an additional signal path.

This invention offers features of either less performance degradation or less circuits redundancy than previous arts. This new method can be applied to various configurations in sigma-delta modulators, such as multiple feedback(MF), feedforward(FF), and follow the leader, etc.

BRIEF DESCRIPTION OF THE DRAWINGS

For a more complete understanding of this invention and its advantages, thereof, reference is now made to the following description taken in conjunction with the accompanying drawings in which:

FIGS. 6(b) and 6(c) show a time plot of integrator output and a time plot of effective order resulting from the time-domain simulation, respectively;

DETAILED DESCRIPTION OF THE INVENTION

Figure 1:
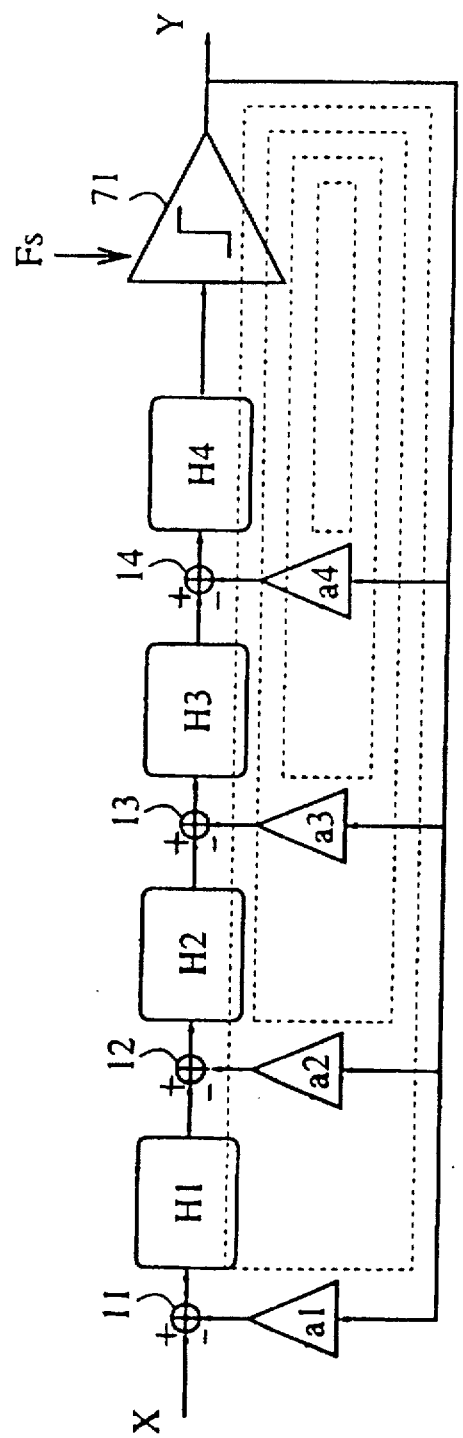
FIG. 1 is a block diagram which shows a prior art fourth-order MF sigma-delta modulator.

The present invention discloses a multiple feedback sigma-delta modulator comprising:

- a filter means comprising at least two cascaded stages for receiving an input signal of the modulator and a set of feedback signals, and producing a filtered signal;
- a quantizer means, sampled at frequency Fs, for quantizing said filtered signal, and producing an output signal of the modulator and a set of quantized signals;
- an instability detection means, coupled to said filter means, for detecting and generating a control signal indicating whether the sigma-delta modulator enters an unstable region or a stable region; and
- a selection means, coupled to said instability detection means, for receiving a scaled signal from an output of each stage in said cascaded stages and scaled signals from said set of quantized signals, and producing said set of feedback signals to adjust an effective order of the sigma-delta modulator according to said control signal;

The first stage in said cascaded stages receives a scaled said input signal of the modulator, and optionally scaled signals from the output of its succeeding stages (not in said set of feedback signals) with inverse polarity, and optionally signals from said set of feedback signals with inverse polarity.

Each stage except the first stage in said cascaded stages receives a scaled signal from the output of its preceding stage, and optionally a scaled said input signal of the modulator, and optionally scaled signals from the output of its succeeding stages (not in said set of feedback signals) with inverse polarity, and optionally signals from said set of feedback signals with inverse polarity.

The last stage in said cascaded stages produces said filtered signal of said filter means.

Said selection means selectively connects a scaled signal from an output of a stage in said cascaded stages or a scaled signal from said set of quantized signals with inverse polarity to an input of a stage in said cascaded stages as one of said set of feedback signals.

The present invention further discloses a feedforward sigma-delta modulator comprising:

a filter means comprising at least two cascaded stages for receiving an input signal of the modulator, a quantized signal, and a set of feedback signals and producing a set of filtered signals;

a summer means for receiving a scaled set of forward signals and producing a summing signal;

a quantizer means, sampled at frequency Fs, for quantizing said summing signal, and producing an output signal of the modulator and said quantized signal;

an instability detection means, coupled to said filter means, for detecting and generating a control signal indicating whether the sigma-delta modulator enters an unstable region or a stable region; and a selection means, coupled to said instability detection means, for receiving said set of filtered signals and producing said set of feedback signals and said set of forward signals to adjust an effective order of the sigma-delta modulator according to said control signal.

The first stage in said cascaded stages of said feedforward sigma-delta modulator preferably receives a scaled said input signal of the modulator, and a scaled said quantized signal with inverse polarity, and optionally scaled signals from its succeeding stages output (not in said scaled set of feedback signals) with inverse polarity, and optionally scaled signals from said set of feedback signals with inverse polarity, and produces one of said set of filtered signals.

Each stage, except the first one, of said cascaded stages of said feedforward sigma-delta modulator preferably receives a scaled signal from the output of its preceding stage, and optionally a scaled said input signal of the modulator, and optionally scaled signals from its succeeding stages output (not in said scaled set of feedback signals) with inverse polarity, and optionally scaled signals from said set of feedback signals with inverse polarity, and produces signals of said set of filtered signals.

Preferably, said selection means of said feedforward sigma-delta modulator selectively connects one of said set of filtered signals to either said summer means, as one of said set of forward signals, or to an input of a stage in said cascaded stages, with inverse polarity, as one of said set of feedback signals.

In sigma-delta modulators, there exist various configurations to perform a desired noise shaping function. For instance, in FIG.1 and FIG. 7, a multiple feedback (MF) and a feedforward (FF) configurations are shown, respectively. The present invention can be applied to various configurations that have been proposed. However, for clarity, in the following we will describe several particular embodiments of our invention applied to the MF and FF configurations.

More specifically, we describe how to apply our invention to fourth-order MF and FF modulators. One skilled in the art will recognize that this invention is not limited to the specific embodiments disclosed, and can be more generally applied to other configurations, such as follow the leader, and modulators with any order (order N>1) different from those illustrated.

In FIG. 1, a fourth-order MF sigma-delta modulator is shown. This modulator is called a fourth-order one, in this invention, because there exist four cascaded stages H1, H2, H3 and H4. In a low-pass sigma-delta modulator, by which we mean the quantization noise is shaped to higher frequency, each stage in FIG. 1 can be realized as an integrator. On the other hand, in a band-pass sigma-delta modulator, by which we mean the signal band is centered at a nonzero frequency, each stage can be realized as a resonator. All coefficients are arranged to meet a desired noise transfer function while a near constant signal transfer function in signal band is maintained. In FIG. 1, a scaled (scaled by a1) feedback signal produced by quantizer means 71, is subtracted from the input signal X via subtractor means 11, and the difference is applied to the first stage H1. Similarly, subtractor means 12, 13, and 14 are used to subtract scaled (scaled by a2, a3, and a4) feedback signals produced by quantizer means 71 from the output signals of H1, H2, and H3, and the difference are applied to H2, H3, and H4, respectively. The output of H4 is applied to quantizer means 71 then the modulator output Y is obtained. The quantizer means 71 is sampled at frequency Fs. In an analog sigma-delta modulator for receiving an analog signal and producing a digital output, which is used in a sigma-delta analog-to-digital converter, the quantizer comprises a coarse analog-to-digital converter and a digital-to-analog converter, and the modulator output Y is taken from the output of the coarse analog-to-digital converter. In a digital sigma-delta modulator for receiving and producing digital signals, which is used in a sigma-delta digital-to-analog converter, the quantizer is a coarse digital quantizer. The implementation of the necessary circuits to realize the sigma-delta modulator is in a manner well-known to those skilled in the art.

Figure 2:
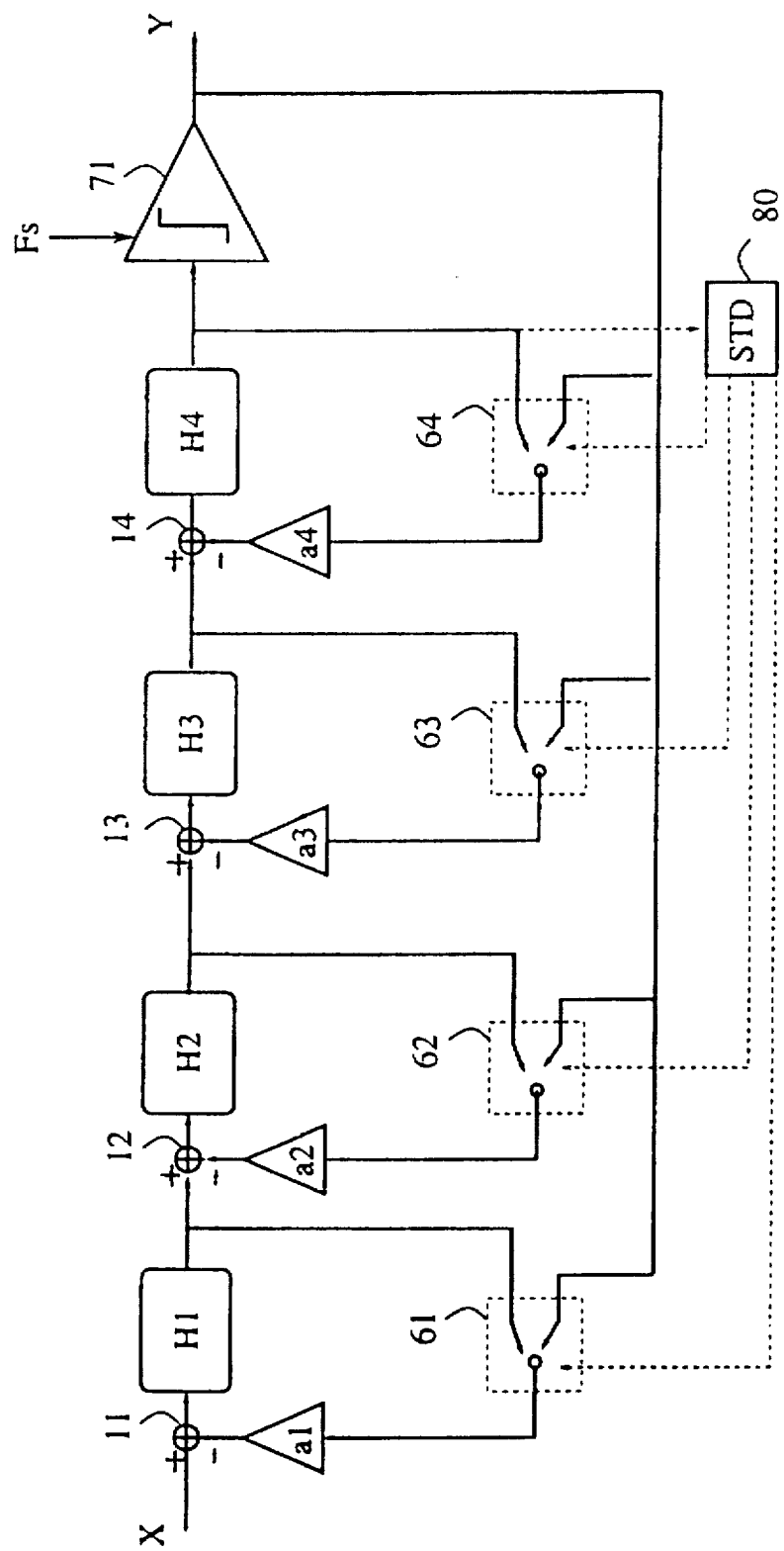
FIG. 2 is a block diagram which shows a fourth-order MF sigma-delta modulator incorporating a first embodiment of the first kind of the present invention.
Figure 3:
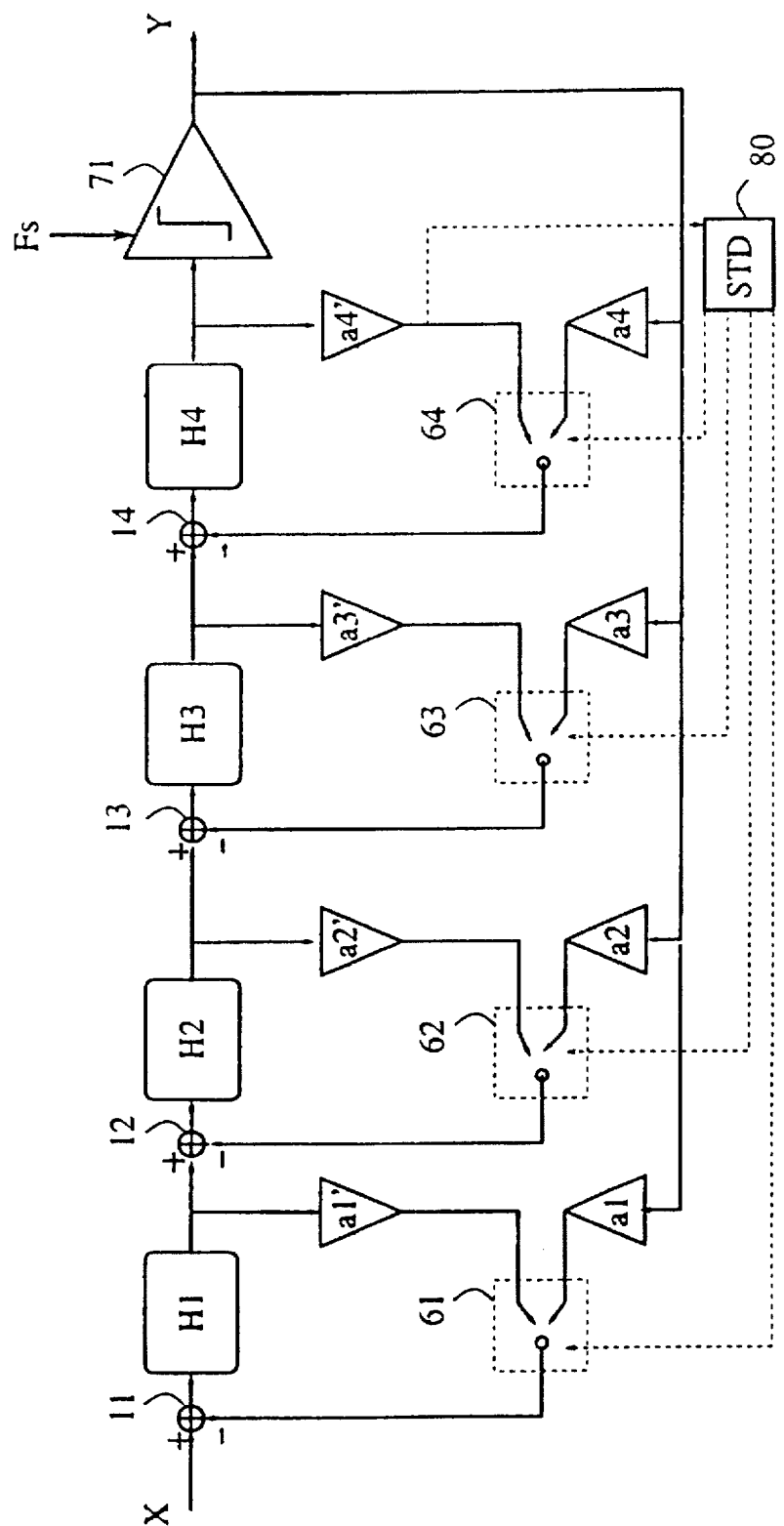
FIG. 3 is a block diagram which shows a fourth-order MF sigma-delta modulator incorporating a second embodiment of the first kind of the present invention.
Figure 4:
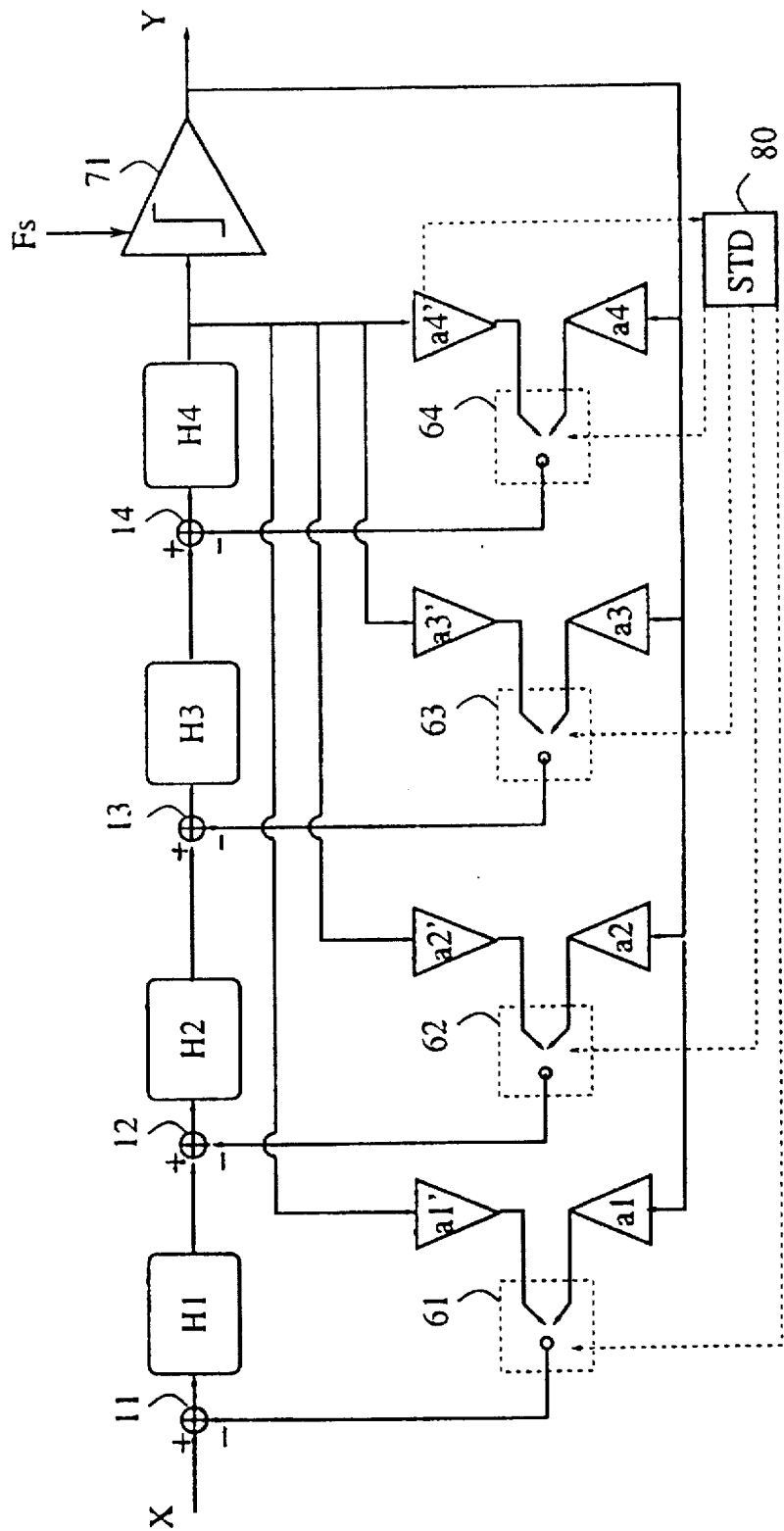
FIG. 4 is a block diagram which shows a fourth-order MF sigma-delta modulator incorporating a third embodiment of the first kind of the present invention.

In FIG. 1, we point out that, by dashed lines, there are four loops passing through quantizer means 71. By defining the effective order as the number of loops passing through the quantizer means, the modulator in FIG. 1 is said to be a fourth-order modulator with effective order 4. In FIG. 2, we illustrate a particular embodiment of our invention, in spirit of reduction of the effective order, to stabilize an unstable modulator. In FIG. 2, a stability detection (STD) means 80 is used to detect whether the modulator enters the stable region or not. The STD means 80 comprises comparators for detecting the signal at one or more than one nodes in the modulator, and the modulator is said to entering the unstable region if the signal at one or more than one nodes exceed a predetermined range. If the modulator enter the unstable region at time sample n, the effective order is reduced by one at time sample n+1. If the effective order is 4 at time sample n, we will linearize the fourth stage at time sample n+1, by switching the selection means 64 so that the inner feedback path passing through a4 is switched from the output of quantizer means 71 to the fourth stage output. If the effective order is 3 at time sample n, we will linearize the third stage order in time sample n+1, by switching the selection means 63 so that the inner feedback path passing through a3 is switched from the output of quantizer means 71 to the third stage output. Similarly, If the effective order is 2 (1) in time sample n, we linearize the second (first) stage in time sample n+1, by switching the selection means 62 (61). The minimum effective order is zero. On the other hand, if the modulator enters the stable region at time sample m, the effective order is increased, at time sample m+1, in a sequence opposite to that when the effective order is reduced. For instance, If the effective order is 2 (only the third and fourth stage are linearized) at time sample m, the selection means 63 switches the inner path passing through a3 from the output of the third stage to the output of quantizer means 71. In FIG. 3, we show another embodiment of our invention in which a second set of feedback coefficients (a1'-a4') are used. This set of coefficients provide room for performance adjustment, in stability point of view. In addition, in digital modulator, coefficients a1'-a4' could be truncated as a single digit so that only shift operation is required in the instability recovery period. In the spirit of reduction of effective order, a third embodiment of our invention is shown in FIG. 4. The only difference between this modulator and that shown in FIG. 3 is that each inner feedback path is switched to the fourth stage output rather than individual stage output when a stage is linearized.

What's the difference, in stability, between a modulator with order 4 and another modulator with effective order 1 (or 2, 3)? It is found that the internal state transition in a modulator with higher effective order tends to diverge more severely than that in a modulator with lower effective order. And empirical studies show that the stability depends on not only the coefficients but also the topologies of the modulators. In other words, there exists difference in stability between modulators with the same effective order. One way to judge the stability is to explore the state transition behavior inside the modulator, and a brute-force method to guarantee the stability is to make that all states inside the modulator will not diverge, in a short period, for all initial conditions and input excitations. It is noted that although the effective order is simply defined as the number of loops that pass through the quantizer, each stage within said loops should be connected properly. More precisely, in reducing the effective order in MF modulators we disconnect some paths that originally pass through the quantizer, in addition, these paths are employed to make the linearized stages leaky. For instance, the inner feedback path through a3' in the modulator shown in FIG. 3 is employed to make the third stage leaky when the third stage is linearized.

From our discussion addressed above and the particular embodiments of our invention shown in FIG. 2 FIG. 3, and FIG. 4, it is obvious that there exist many other possibilities in realizing the modulators with the same effective order. The choice of modulator topology could be judged by one skilled in the art by performance and cost consideration. It is believed that one skill in the art will appreciate that modification and substitution can be made in FIG. 2, FIG. 3, and FIG. 4 as another realization of our invention, applied to the MF modulators.

Figure 5:
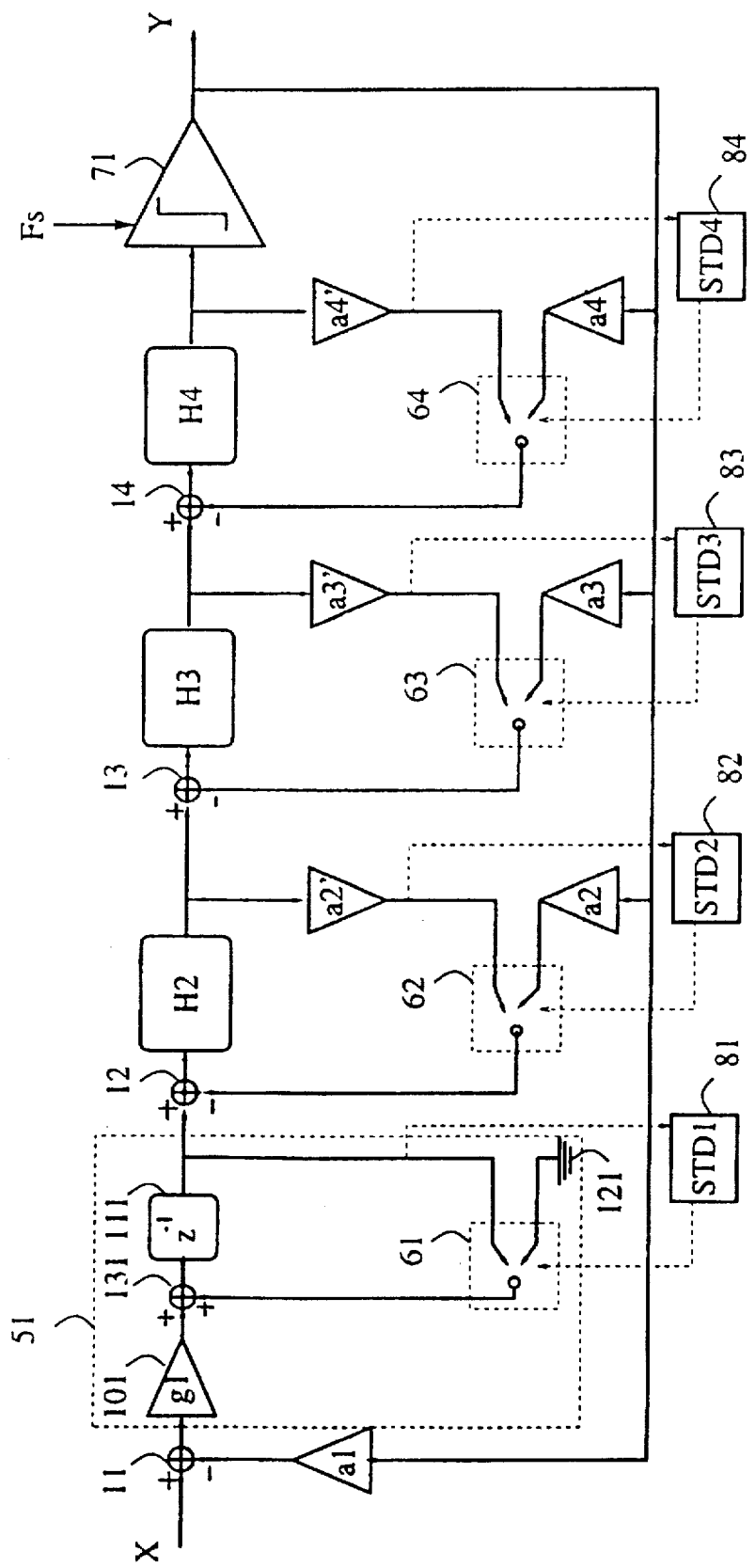
FIG. 5 is a block diagram which shows a fourth-order MF sigma-delta modulator incorporating a fourth embodiment of the second kind of the present invention.

In above discussion, the stabilization mechanism provided by this invention is supported by reduction of the effective order. In a second kind of embodiment of this invention, the stability can be supported by individual instability recovery in every stage in the sigma-delta modulator. In FIG. 5, we show a particular embodiment of our invention in a fourth-order MF modulator. The structure of this sigma-delta modulator is similar to that presented in FIG. 3, thus only differences between them will be described below. In FIG. 5, four identical stability detection means 81–84 are used to detect the output signal of each stage in the four cascaded stages. For the last three stages, if their output signals exceed a predetermined range, they will be linearized. Such linearization provides not only said effect supported by reduction of effective order, but also an instability recovery mechanism in said stage if feedback coefficients are adopted properly. For the first stage, if its output exceeds a predetermined range, it could be replaced by a sample/hold circuit. In the particular embodiment shown in FIG. 5, wherein the first stage is a integrator 51, the integrator 51 comprises a scaling means 101, a summer means 131, and a delay means 111. And the replacement of an integrator by a sample/hold circuit is achieved by switching the inner feedback path, via selection means 61 from its output to a ground means 121. The ground means 121 represents a zero signal. If the first stage output fall into said predetermined range again, selection means 61 will recover the inner feedback from the ground means 121 to the first stage output. For proper coefficients adopted, a sample/hold circuit can recover a unstable stage to stable operation by receiving a limited input signal. Although only illustrating a simple case, one skilled in the art can easily realize other circuits and method suitable to perform such switching activities between a integrator (or resonator) circuit and a sample/hold circuit, in both analog and digital domain.

Figure 6:
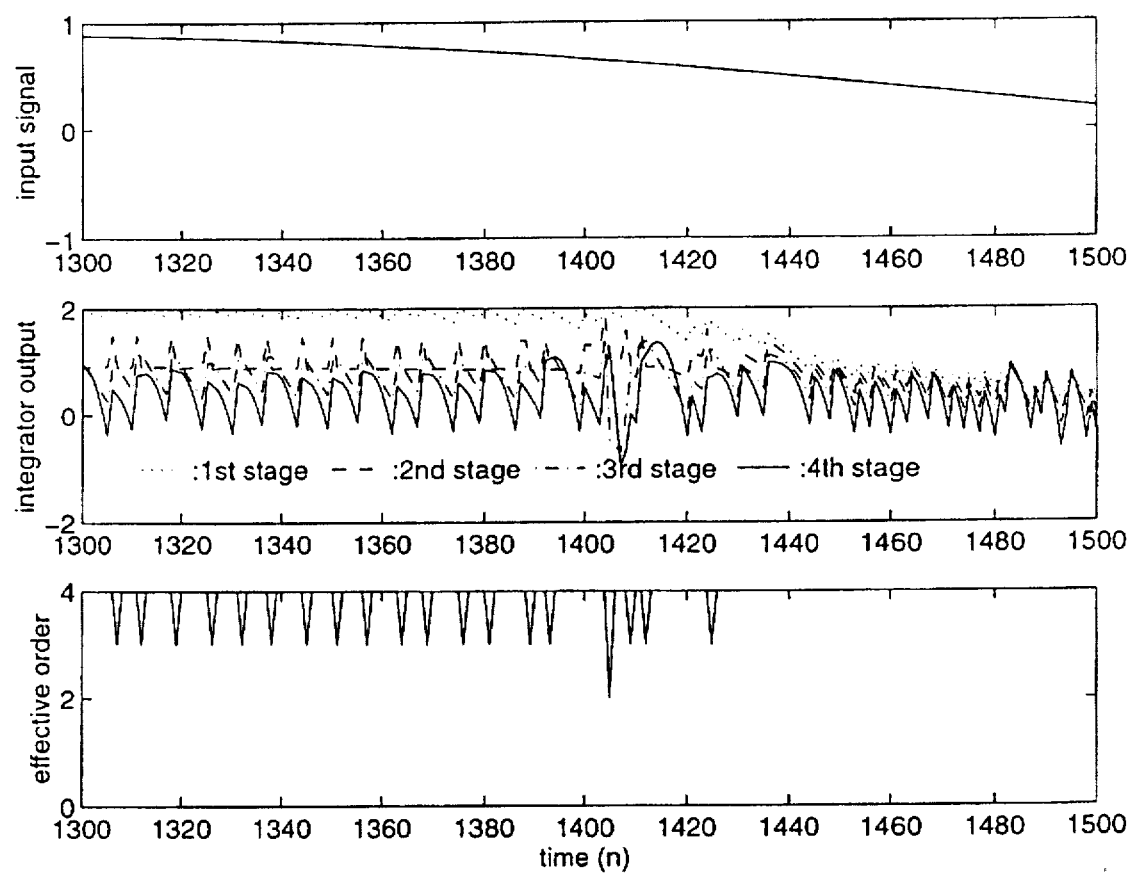
FIG. 6 (a) shows a time plot of an input signal for a time-domain simulation using a fourth-order MF modulator of the present invention.

In the following, we show a simulation result of our invention. The modulator adopted is that shown in FIG. 5, but there exists no instability recovery mechanism in the first stage. The simulation condition is: all four stages (H1–H4) are discrete-time integrators with scaling coefficients 0.1725, 0.1534, 0.2802, and 0.6420, respectively; a1=1, a2=1.8940, a3=1.4469, a4=a4'=1.1314, a2'=4, a3'=6, OSR=64; said predetermined range in each stage is (−1.4, 1.4); integrator output saturation levels =±2; the quantizer means 71 is a single-bit quantizer (outputs ±1); and the input signal is a sinusoidal wave with −1 dB amplitude (normalized to unity) and frequency Fi=Fs/1024. In FIG. 6, time-domain simulation results are shown. It is noted in the bottom subplot that the effective order is not necessary to reduced to 1 to stabilize the modulator. Without the stabilization mechanism provided by our invention, the integrators output will lock in oscillation between saturation levels when an input signal with such large amplitude is applied and even removed later.

Figure 7:
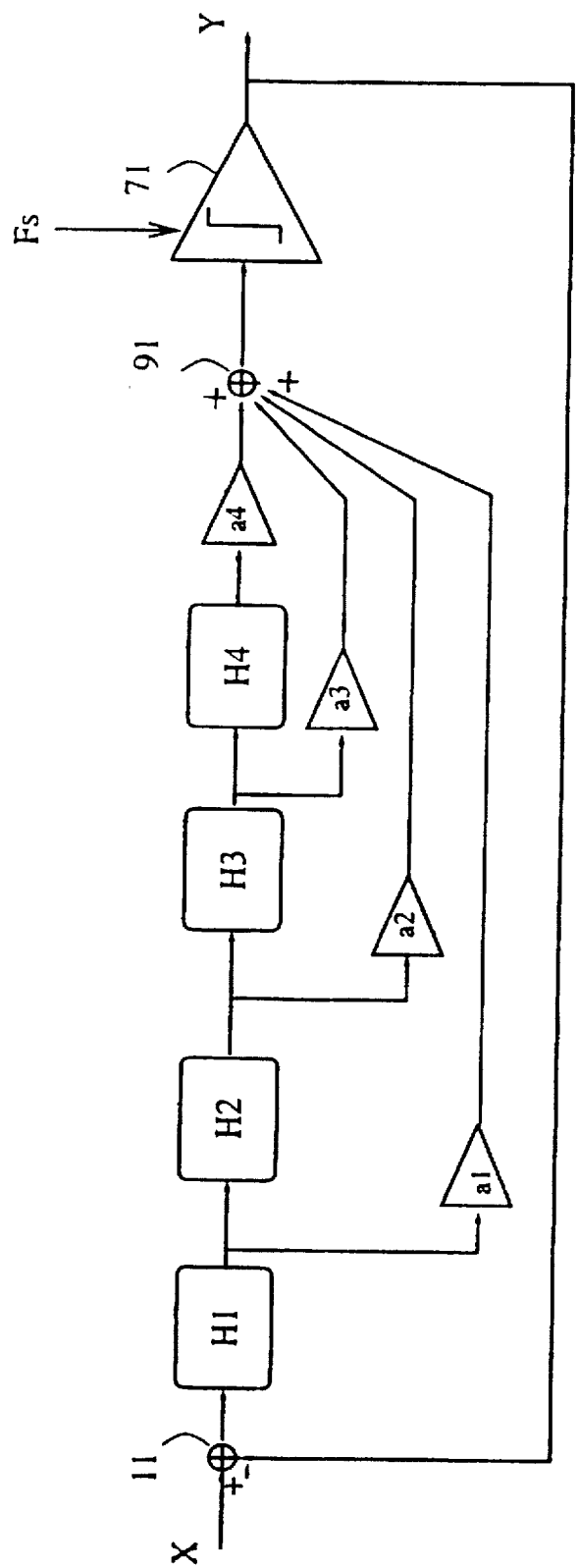
FIG. 7 is a block diagram which shows a prior art fourth-order FF sigma-delta modulator.
Figure 8:
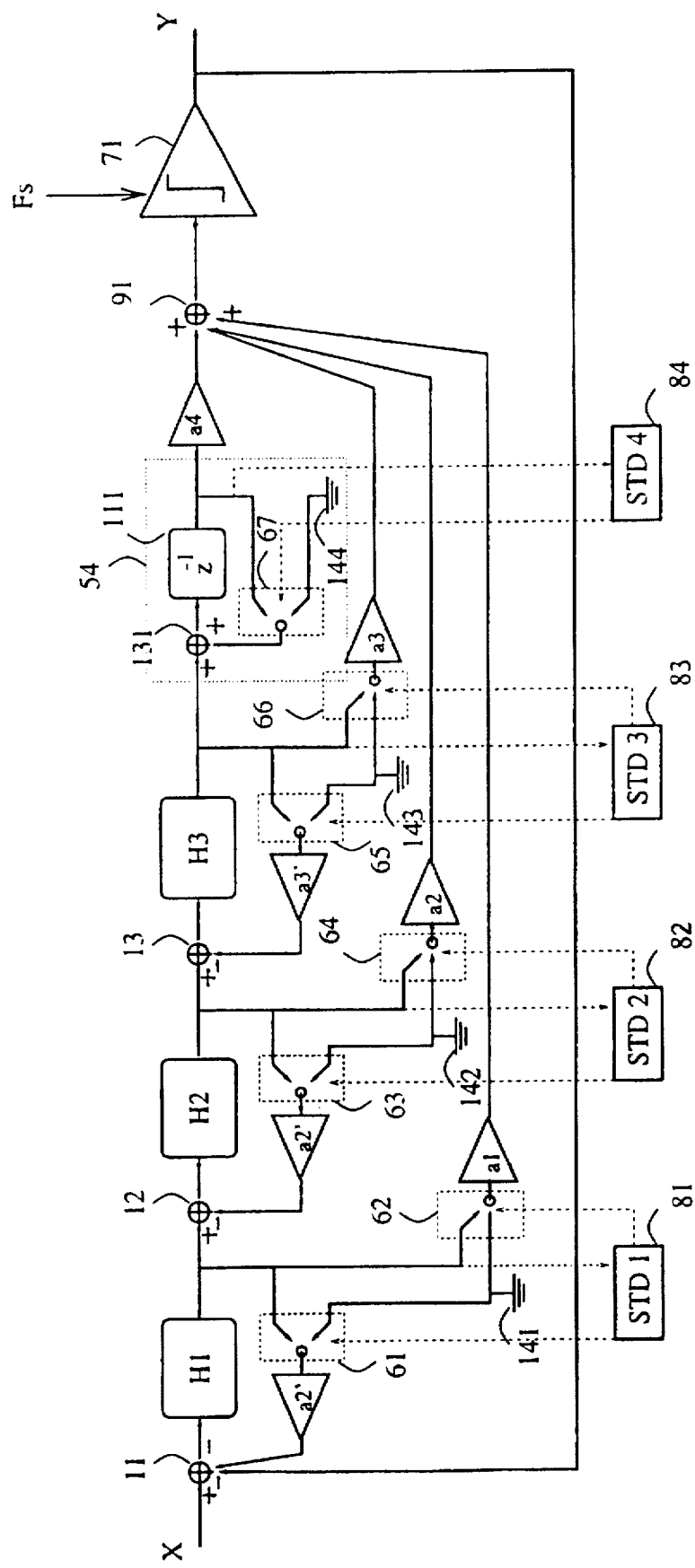
FIG. 8 is a block diagram which shows a fourth-order FF sigma-delta modulators incorporating a fifth embodiment of the second kind of the present invention.

For FF modulators, we show a fourth-order FF modulator in FIG. 7. A subtractor means 11 subtracts the feedback signal produced by a quantizer means 71 from the input signal X, and the difference is applied to an input terminal of the first stage H1 which produces a forward signal at its output terminal, scaled by a1, to a summer means 91. Each stage except the first stage in the modulator receives an output signal of its proceeding stage and produces a forward signal, scaled by a2, . . . ,a4, to the summer means 91. Quantizer means 71, sampled at frequency Fs, quantizes the output signal of the summer means 91 and produces the output signal of the modulator Y. And it is noted that there are four loops, passing through a1, a2, a3, and a4, linked with the quantizer means 71. In FIG. 8, a particular embodiment of our invention applied to a fourth-order FF modulator is shown, and only the difference between it and the modulator in FIG. 7 will be described below. In FIG. 8, four identical STD means 81–84 are used to detect the output of each stage in the four cascaded stages. For the first three stages, if their output signals exceed a predetermined range, they will be linearized and the effective order is reduced correspondingly. For instance, we linearize the second stage by switching the selection means 63 and 64 so that the output signal of the second stage is send backward to its input, scaled by a2', with inverse polarity rather than forward to the summer means 91. In addition, in linearizing the second stage, a ground means 142 is used to provide the necessary zero signal for selection means 63 and 64. For the fourth stage, if its output exceeds a predetermined range, it will be replaced by a sample/hold circuit in similar way to that for the first stage shown in FIG. 5. Although only illustrating simple cases, one skilled in the art can easily realize other circuits and method suitable to perform the necessary switching activities in this invention, in both analog and digital domain.

Although particular embodiments of the invention have been described, various alternations, modifications, and improvements will readily occur to those skilled in the art. Accordingly, the forgoing description is by way of example only and is not intended as limiting. This invention is limited only as defined in the following claims and the equivalents thereto.

What is claimed is:

1. A sigma-delta modulator comprising:
    a filter means comprising at least two cascaded stages for receiving an input signal of the modulator and a set of feedback signals, and producing a filtered signal;
    a quantizer means, sampled at frequency Fs, for quantizing said filtered signal, and producing an output signal of the modulator and a set of quantized signals;
    an instability detection means, coupled to said filter means, for detecting and generating a control signal indicating whether the sigma-delta modulator enters an unstable region or a stable region; and
    a selection means, coupled to said instability detection means, for receiving a scaled signal from an output of each stage in said cascaded stages and scaled signals from said set of quantized signals, and producing said set of feedback signals to adjust an effective order of the sigma-delta modulator according to said control signal.

2. The sigma-delta modulator of claim 1, wherein the first stage in said cascaded stages receives a scaled said input signal of the modulator, and optionally scaled signals from the output of its succeeding stages (not in said set of feedback signals) with inverse polarity, and optionally signals from said set of feedback signals with inverse polarity.

3. The sigma-delta modulator of claim 1, wherein each stage except the first stage in said cascaded stages receives a scaled signal from the output of its preceding stage, and optionally a scaled said input signal of the modulator, and optionally scaled signals from the output of its succeeding stages (not in said set of feedback signals) with inverse polarity, and optionally signals from said set of feedback signals with inverse polarity.

4. The sigma-delta modulator of claim 1, wherein the last stage in said cascaded stages produces said filtered signal.

5. The sigma-delta modulator of claim 1, wherein each stage in said cascaded stage is realized as an integrator or a resonator.

6. The sigma-delta modulator of claim 1, wherein each stage in said cascaded stage is realized in either discrete-time or continuous-time circuits.

7. The sigma-delta modulator of claim 1, wherein the sigma-delta modulator is said to entering the unstable region if the signal at one or more than one nodes in said cascaded stages exceed a predetermined range, and the sigma-delta modulator is said to entering the stable region if no signal at the nodes in said cascaded stages exceeds said predetermined range.

8. The sigma-delta modulator of claim 7, wherein the instability detection means comprises comparators for detecting the signal at one or more than one nodes in said cascaded stages to determine whether the sigma-delta modulator enters the unstable region or the stable region.

9. The sigma-delta modulator of claim 1, wherein said selection means selectively connects a scaled signal from an output of a stage in said cascaded stages or a scaled signal from said set of quantized signals with inverse polarity to an input of a stage in said cascaded stages as one of said set of feedback signals.

10. The sigma-delta modulator of claim 7, wherein the effective order is the number of stages, in said cascaded stages, that receives a signal from said set of quantized signals, as one of said set of feedback signals, via said selection means.

11. The sigma-delta modulator of claim 10, wherein the effective order is reduced at time sample n+1 if the modulator enters the unstable region at time sample n, and the minimum of said effective order is zero.

12. The sigma-delta modulator of claim 10, wherein the effective order is increased at time sample m+1 if the modulator enters the stable region at time sample m, and the maximum of said effective order is the number of stages in said cascaded stages.

13. A sigma-delta modulator comprising:
    a filter means comprising at least two cascaded stages for receiving an input signal of the modulator, a quantized signal, and a set of feedback signals and producing a set of filtered signals;
    a summer means for receiving a scaled set of forward signals and producing a summing signal;
    a quantizer means, sampled at frequency Fs, for quantizing said summing signal, and producing an output signal of the modulator and said quantized signal;
    an instability detection means, coupled to said filter means, for detecting and generating a control signal indicating whether the sigma-delta modulator enters an unstable region or a stable region; and
    a selection means, coupled to said instability detection means, for receiving said set of filtered signals and producing said set of feedback signals and said set of forward signals to adjust an effective order of the sigma-delta modulator according to said control signal.

14. The sigma-delta modulator of claim 13, wherein the first stage in said cascaded stages receives a scaled said input signal of the modulator, and a scaled said quantized signal with inverse polarity, and optionally scaled signals from its succeeding stages output (not in said scaled set of feedback signals) with inverse polarity, and optionally scaled signals from said set of feedback signals with inverse polarity, and produces one of said set of filtered signals.

15. The sigma-delta modulator of claim 13, wherein each stage, except the first one, of said cascaded stages receives a scaled signal from the output of its preceding stage, and optionally a scaled said input signal of the modulator, and optionally scaled signals from its succeeding stages output (not in said scaled set of feedback signals) with inverse polarity, and optionally scaled signals from said set of feedback signals with inverse polarity, and produces signals of said set of filtered signals.

16. The sigma-delta modulator of claim 13, wherein each stage in said cascaded stage is realized as an integrator or a resonator.

17. The sigma-delta modulator of claim 13, wherein each stage in said cascaded stage is realized in either discrete-time or continuous-time circuits.

18. The sigma-delta modulator of claim 13, wherein the sigma-delta modulator is said to entering the unstable region if the signal at one or more than one nodes in said cascaded stages exceed a predetermined range, and the sigma-delta modulator is said to entering the stable region if no signal at the nodes in said cascaded stages exceeds said predetermined stage.

19. The sigma-delta modulator of claim 18, wherein the instability detection means comprises comparators for detecting the signal at one or more than one nodes in said cascaded stages to determine whether the sigma-delta modulator enters the unstable region or the stable region.

20. The sigma-delta modulator of claim 13, wherein said selection means selectively connects one of said set of filtered signals to either said summer means, as one of said set of forward signals, or to an input of a stage in said cascaded stages, with inverse polarity, as one of said set of feedback signals.

21. The sigma-delta modulator of claim 18, wherein the effective order is the number of stages, in said cascaded stages, that provides said filtered signal to said summer means, as one of said set of forward signals, via said selection means.

22. The sigma-delta modulator of claim 21, wherein the effective order is reduced at time sample n+1 if the modulator enters the unstable region at time sample n, and the minimum of said effective order is zero.

23. The sigma-delta modulator of claim 21, wherein the effective order is increased at time sample m+1 if the modulator enters the stable region at time sample m, and the maximum of said effective order is the number of stages in said cascaded stages.

24. A sigma-delta modulator comprising:
   a filter means comprising at least two cascaded stages for receiving an input signal of the modulator and a set of feedback signals, and producing a filtered signal;
   a quantizer means, sampled at frequency Fs, for quantizing said filtered signal, and producing an output signal of the modulator and a set of quantized signals;
   a plurality of instability detection means, each of which is coupled to one stage in said cascaded stages for detecting and generating a control signal indicating whether said stage enters an unstable region or a stable region; and
   a plurality of selection means, each of which is coupled to one of said plurality of instability detection means for receiving a scaled signal from an output of said stage which is coupled to said one of said plurality of instability detection means and a scaled signal from said set of quantized signals, and for producing a signal of said set of feedback signals to said stage input according to said control signal.

25. The sigma-delta modulator of claim 24, wherein the first stage in said cascaded stages receives a scaled said input signal of the modulator, and optionally scaled signals from the output of its succeeding stages (not in said set of feedback signals) with inverse polarity, and a scaled signal from said set of feedback signals with inverse polarity.

26. The sigma-delta modulator of claim 24, wherein each stage except the first stage in said cascaded stages receives a scaled signal from the output of its preceding stage, and optionally a scaled said input signal of the modulator, and optionally scaled signals from the output of its succeeding stages (not in said set of feedback signals) with inverse polarity, and a scaled signal from said set of feedback signals with inverse polarity.

27. The sigma-delta modulator of claim 24, wherein the last stage in said cascaded stages produces said filtered signal.

28. The sigma-delta modulator of claim 24 wherein each stage in said cascaded stage is realized as an integrator or a resonator.

29. The sigma-delta modulator of claim 24 wherein each stage in said cascaded stages is realized in either discrete-time or continuous-time circuits.

30. The sigma-delta modulator of claim 24 wherein each stage in said cascaded stages is said to entering the unstable region if its output signal exceeds a predetermined range, otherwise, said stage is said to entering the stable region.

31. The sigma-delta modulator of claim 30 wherein each one of said plurality of instability detection means comprises comparators for detecting an output signal of one stage in said cascaded stages to determine whether said stage enters the unstable region or the stable region.

32. The sigma-delta modulator of claim 30, wherein the first selection means of said plurality of selection means optionally connects a scaled output signal of the first stage in said cascaded stages with inverse polarity, as one of said set of feedback signals, to an input of first stage at time sample n+1 when the first stage enters the unstable region at time sample n.

33. The sigma-delta modulator of claim 32, wherein the fist selection means of said plurality of selection means will connect a scaled signal from said set of quantized signals with inverse polarity, as one of said set of feedback signals, to an input of the first stage in said cascaded stages at time sample m+1 when the first stage enters the stable region at time sample m.

34. The sigma-delta modulator of claim 30, wherein the first stage in said cascaded stages is optionally replaced by a sample/hold circuit and the first selection means will connect a scaled signal from said set of quantized signal with inverse polarity, as one of said set of feedback signals, to an input of the first stage at time sample n+1 when the first stage enters the unstable region at time sample n.

35. The sigma-delta modulator of claim 34, wherein said sample/hold circuit will be replaced by the original circuit of the first stage at time sample m+1 when the first stage enters the stable region at time sample m.

36. The sigma-delta modulator of claim 30, wherein the i-th selection means of said plurality of selection means connects a scaled output signal of the i-th stage in said cascaded stages with inverse polarity, as one of said set of feedback signals, to an input of i-th stage at time sample n+1 when the i-th stage enters the unstable region at time sample n, wherein i=2, . . . ,N, and N is number of stages in said cascaded stages.

37. The sigma-delta modulator of claim 30, wherein the i-th selection means of said plurality of selection means connects a scaled signal from said set of quantized signals with inverse polarity, as one of said set of feedback signals, to an input of the i-th stage in said cascaded stages at time sample m+1 when the i-th stage enters the stable region at time sample m, wherein i=2, . . . ,N, and N is number of stages in said cascaded stages.

38. A sigma-delta modulator comprising:
   a filter means comprising at least two cascaded stages for receiving an input signal of the modulator, a quantized signal, and a set of feedback signals and producing a set of filtered signals;
   a summer means for receiving a scaled set of forward signals and producing a summing signals;
   a quantizer means, sampled at frequency Fs, for quantizing said summing signal, and producing an output signal of the modulator and said quantized signal;
   a plurality of instability detection means, each of which is coupled to one stage in said cascaded stages for detecting and generating a control signal indicating whether said stage enters an unstable region or a stable region; and a plurality of selection means, each of which is coupled to one of said plurality of instability detection means for receiving an output signal from said stage which is coupled to said one of said plurality of instability detection means as one of said set of filtered signals and producing one of said set of feedback signals to said stage input or one of said set of forward signals according to said control signal.

39. The sigma-delta modulator of claim 38, wherein the first stage in said cascaded stages receives a scaled said input signal of the modulator, and a scaled said quantized signal with inverse polarity, and optionally scaled signals from its succeeding stages output (not in said scaled set of feedback signals) with inverse polarity, and optionally a scaled signal from said set of feedback signals with inverse polarity, and produces one of said set of filtered signals.

40. The sigma-delta modulator of claim 38, wherein each stage, except the first one, of said cascaded stages receives a scaled signal from the output of its preceding stage, and optionally a scaled said input signal of the modulator, and optionally scaled signals from its succeeding stages output (not in said scaled set of feedback signals) with inverse polarity, and optionally scaled signals from one of said set of feedback signals with inverse polarity, and produces signals of said set of filtered signals.

41. The sigma-delta modulator of claim 38, wherein each stage in said cascaded stage is realized as an integrator or a resonator.

42. The sigma-delta modulator in claim 38, wherein each stage in said stages is realized in either discrete-time or continuous-time circuits.

43. The sigma-delta modulator of claim 38, wherein each stage in said cascaded stages is said to entering the unstable region if its output signal exceeds a predetermined range, otherwise, said stage is said to entering the stable region.

44. The sigma-delta modulator of claim 43, wherein each one of said plurality of instability detection means comprises comparators for detecting an output signal of each stage in said cascaded stages to determine whether said stage enters the unstable region or the stable region.

45. The sigma-delta modulator of claim 43, wherein the i-th selection means of said plurality of selection means connects an output signal of the i-th stage in said cascaded stages, as one of said set of filtered signals, with inverse polarity to an input of i-th stage, as one of said set of feedback signals, at time sample n+1 when the i-th stage enters the unstable region at time sample n, wherein $i=1, \ldots, N-1$, and N is the number of stages in said cascaded stages.

46. The sigma-delta modulator of claim 43, wherein the i-th selection means of said plurality of selection means connects an output signal of the i-th stage in said cascaded stages, as one of said set of filtered signals, to said summer means, as one of said set of forward signals, at time sample m+1 when the i-th stage enters the stable region at time sample m, wherein $i=1, \ldots, N-1$, and N is the number of stages in said cascaded stages.

47. The sigma-delta modulator of claim 43, wherein the last selection means of said plurality of selection means optionally connects an output signal of the last stage in said cascaded stages, as one of said set of filtered signals, with inverse polarity to an input of last stage, as one of said set of feedback signals, at time sample n+1 when the last stage enters the unstable region at time sample n.

48. The sigma-delta modulator of claim 47, wherein the last selection means of said plurality of selection means will connect an output signal of the last stage in said cascaded stages, as one of said set of filtered signals, to said summer means, as one of said set of forward signals, at time sample m+1 when the last stage enters the stable region at time sample m.

49. The sigma-delta modulator of claim 38, wherein the last stage in said cascaded stages is optionally replaced by a sample/hold circuit and the last selection means will connect the output of the last stage, as one of said set of filtered signals, to said summer means, as one of said set of forward signals, at time sample n+1 when the last stage enters the unstable region at time sample n.

50. The sigma-delta modulator of claim 49, wherein said sample/hold circuit will be replaced by the original circuit of the last stage at time sample m+1 when the last stage enters the stable region at time sample m.

* * * * *

UNITED STATES PATENT AND TRADEMARK OFFICE
CERTIFICATE OF CORRECTION

PATENT NO. : 5,757,301
DATED : May 26, 1998
INVENTOR(S) : Kuo, et al.

It is certified that error appears in the above-indentified patent and that said Letters Patent is hereby corrected as shown below:

Col. 5, line 23, please insert --effective-- between with and order.

Signed and Sealed this

Eighteenth Day of August, 1998

Attest:

BRUCE LEHMAN

*Attesting Officer*  *Commissioner of Patents and Trademarks*